United States Patent [19]
Cholewa et al.

[11] Patent Number: 5,418,190
[45] Date of Patent: May 23, 1995

[54] METHOD OF FABRICATION FOR ELECTRO-OPTICAL DEVICES

[75] Inventors: Mark B. Cholewa, Mt. Penn Township, Berks County; John W. Osenbach, Kutztown, both of Pa.; Bryan P. Segner, Piscataway, N.J.

[73] Assignee: AT&T Corp., Murray Hill, N.J.

[21] Appl. No.: 175,468

[22] Filed: Dec. 30, 1993

[51] Int. Cl.6 .......................... H01L 21/302
[52] U.S. Cl. .................. 437/226; 437/227; 437/129
[58] Field of Search ............ 437/226, 227, 129

[56] References Cited

U.S. PATENT DOCUMENTS

| | | |
|---|---|---|
| 4,236,296 | 12/1980 | Woolhouse et al. . |
| 4,237,601 | 12/1980 | Woolhouse et al. . |
| 4,604,161 | 8/1986 | Araghi ................ 437/226 |
| 4,904,617 | 2/1990 | Muschke ............. 437/226 |
| 5,314,844 | 5/1994 | Imamura ............. 437/226 |

*Primary Examiner*—R. Bruce Breneman
*Assistant Examiner*—Linda J. Fleck

[57] ABSTRACT

A method of fabricating a semiconductor electro-optical device in which a cleaving apparatus is used to separate the wafer into bars of semiconductor material by striking the wafer from the epitaxial side, directly beneath the substrate side scribe mark. A series of angularly shaped trenches are etched across the epitaxial side of the semiconductor bars to permit bar separation into individual devices that allows a plurality of bars to be processed simultaneously.

8 Claims, 6 Drawing Sheets

METHOD OF FABRICATION FOR ELECTRO-OPTICAL DEVICES

TECHNICAL FIELD

This invention relates generally to the fabrication of electro-optical devices and more particularly, to a method for separating semiconductor wafers into bar form and into individual electro-optical devices.

BACKGROUND OF THE INVENTION

The fabrication of semiconductor electro-optical or photonic devices requires many processing steps to transform an epitaxially grown wafer into an effective electro-optical device. Most of this processing occurs in wafer form and involves forming electrical contacts on both the epitaxial and substrate sides of the wafer. The wafer is cleaved or separated into longitudinal strips, or bars, which extend substantially the full width of the wafer. Each bar is mechanically subsequently cleaved into individual electro-optical devices. Most commonly, the epitaxial side is the p-doped side and the substrate side is the n-doped side. However, the epitaxial side may be the n-doped side when the substrate side is the p-doped side. Electro-optical devices include lasers and light emitting diodes (LEDs).

The current process of semiconductor mirror formation, which involves separating a wafer into bar form (where one of the cleaved surfaces becomes the electro-optical device's mirror or other edge emitting surface), requires scribing the epitaxial side of the wafer to create a point or line of stress concentration to direct the cleavage location. In a conventional method of electro-optical device fabrication, this step produces "hackle," or microscopic steps in the bottom half of the mirror surface which typically causes little or no problem in device performance or yield. Sometimes, however, the hackle may run parallel to the top surface of the device and pass though the active region (top half of the mirror surface), and thereby cause failure and yield reduction. This excessive hackle may also result in parallel propagation to the top surface from the edge of the cleavage point and extending from the substrate side to the epitaxial side of the wafer. The currently employed process also requires slow and costly manual manipulation of the semiconductor bars prior to, and in the course of, separating the bars into individual devices.

The current method of separating semiconductor electro-optical devices from bar form to individual devices requires the incision of short scribe marks at the sides of each device. Rather than scribing the entire width of what is to become the new cleave, a short side scribe is centered on the bar without extending to either facet. Ordinarily, the cleave will follow the entire width of the bar or wafer without the need to scribe the entire width. Side scribing, or scribing only a portion of the width of the cleave path, minimizes some of the deleterious effects of scribing on the integrity of the wafer or bar material.

Scribe marks, however, provide no electrical isolation of individual adjacent devices from one another while the electro-optical devices are still in bar form. Electrical isolation between electro-optical devices is desired since it permits more efficient testing. Moreover, the method of side separation of bars into electro-optical devices based on the creation of scribe marks often results in non-straight edges of the electro-optical device, which can reduce yield and degrade overall chip appearance. Further, the scribing of the bar in the conventional fabrication process often weakens the bar, which results in breakage and yield loss, and may also create unwanted oxide dust that could impair visual inspection of cleaved bars and devices.

It is an object of this invention to provide an improved method of fabricating semiconductor electro-optical devices in which a wafer may be cleaved into bars having mirror facets substantially free of hackle and thus of higher quality and yield.

It is a further object of the invention to provide an improved method of fabricating semiconductor electro-optical devices in which marking the electro-optical device bars for further cleaving into individual devices may be performed more rapidly, and with a higher yield.

It is another object of the invention to provide a method of the type described which achieves electrical isolation of each electro-optical device, better epitaxial side appearance, elimination of oxide layer dust, and a stronger electro-optical device bar.

It is yet a further object of the invention to provide an improved method of fabricating semiconductor electro-optical devices in which cleaving the bars into individual devices may be performed by machine resulting in a faster processing time, higher yield, and better overall epitaxial and substrate side quality.

SUMMARY OF THE INVENTION

The invention achieves these and other objects by the use of substrate side scribing of an substrate side of a semiconductor wafer, with a epitaxially grown layer, for the purpose of separating the wafer into bars. The substrate side scribe marks are placed at the position of the future cleavage point, which becomes the mirror facet of the bar. A cleaving tool strikes the epitaxial side mounted wafer from the epitaxial side at a corresponding position beneath the substrate side scribe mark, such that substantially all applied force acts upon the edge of the wafer with the scribe mark.

In another aspect of the process of the invention, a pattern of lines is photolithographically formed across the epitaxial side of the semiconductor wafer. These lines run between individual semiconductor devices when the wafer is cleaved into bars. The wafer is chemically etched such that the lines allow the formation of trenches. After completion of the etching process the trenches have a depth at least sufficient to reach into the semiconductor substrate and a shape with planar sidewalls and a base having planar surfaces that: meet at an outwardly facing "V" shape.

In a further aspect of the invention the bars are cleaved into devices after they are placed onto a cleaving platform by a machine. During cleaving, the trenches align in a parallel manner, and the bars are cleaved into devices by striking them from the substrate side at a corresponding point opposite the epitaxial side trench. A plurality of electro-optical device bars may be simultaneously struck in the manner so as to cleave a plurality of electro-optical device bars simultaneously.

BRIEF DESCRIPTION OF THE DRAWINGS

The invention will be better understood by reference of the detailed description which follows, read in conjunction with the accompanying drawings in which.

DETAILED DESCRIPTION OF THE INVENTION

Figure 1A:
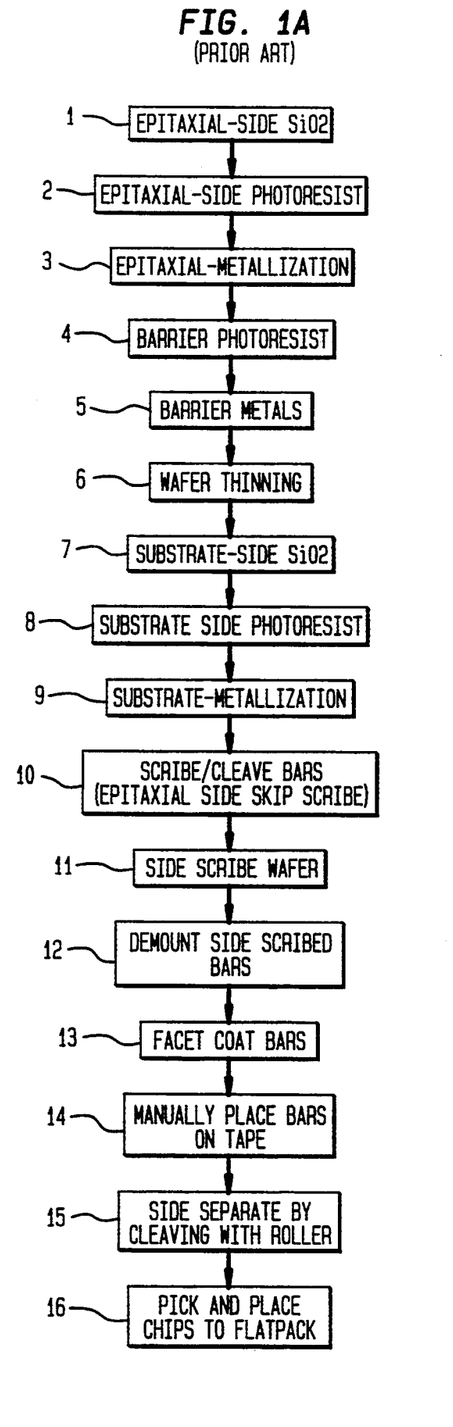
FIG. 1(a) is a list in flow chart form of the major processing steps of a prior art method of electro-optical device processing.

A conventional electro-optical device fabrication process, as illustrated in the flow chart of FIG. 1 (a), begins with a semiconductor substrate, such as of indium phosphide, processed to wafer form by conventional techniques. A fully epitaxially-grown wafer with a defined active region receives a dielectric layer, such as silicon dioxide, as shown at step 1. The epitaxial side is photoresisted as shown at step 2, then metallized as shown at step 3, after which a barrier resist is patterned as shown at step 4. The barrier metals are deposited as shown at step 5, and the partially processed wafer is then thinned as shown at step 6, and its substrate side may be coated with silicon dioxide as shown at step 7. The substrate side of the wafer is then photoresist patterned as shown at step 8 and metallized as shown at step 9.

The bars are then cleaved from the wafer by scribing the wafer on the epitaxial side and subsequent cleaving as shown at step 10, and a short scribe mark is placed along the side of each device after scribing and cleaving the wafer into bars as shown at step 11. This step typically consumes approximately three and a half hours for a typical quadrant of a two-inch wafer, and requires approximately 2500 step and repeat scribes. The bars are demounted as shown at step 12 from the cleaving apparatus after side scribing. These side scribes serve as stress risers for cleaving the bars into individual devices after the facet coating operation as shown at step 13. The conventional process typically results in a yield loss due to fragility during this step in the course of demounting the scribed bars from the tape scribing platform shown at step 12 and facet coating fixture loading and unloading.

Each individual electro-optical device bar is then picked manually with a vacuum pencil and placed on a piece of mounting tape, such as no-tack tape, in a cleaving hoop as shown at step 14. The processing technician places the bars side by side as close to parallel as possible. The bars are placed several to a row and several rows of bars per hoop. This manual method of placing the bars on tape prevents the subsequent use of a cleaving tool, such as a Dynatex cleaving tool, since all the bars require a degree of alignment that is not obtainable by hand.

The mounted bars are then flexed over a dowel or rolled from behind using a special roller as shown at 15. Bending the tape causes the bars to cleave at the scribe mark. This step introduces a yield loss of approximately 5% from "non-cleaving", and also leads to a large variation in substrate side device appearance quality, such as non-straight edges or chip-outs. Further, the side cleaving with the side scribe and flexing over a dowel or roller may produce chipouts and non-straight edges in the device from the side scribe on the epitaxial side. The final step of the conventional process is to pick and place the individual devices from the cleaving hoop and put them in a flatpack, as in step 16.

Figure 1B:
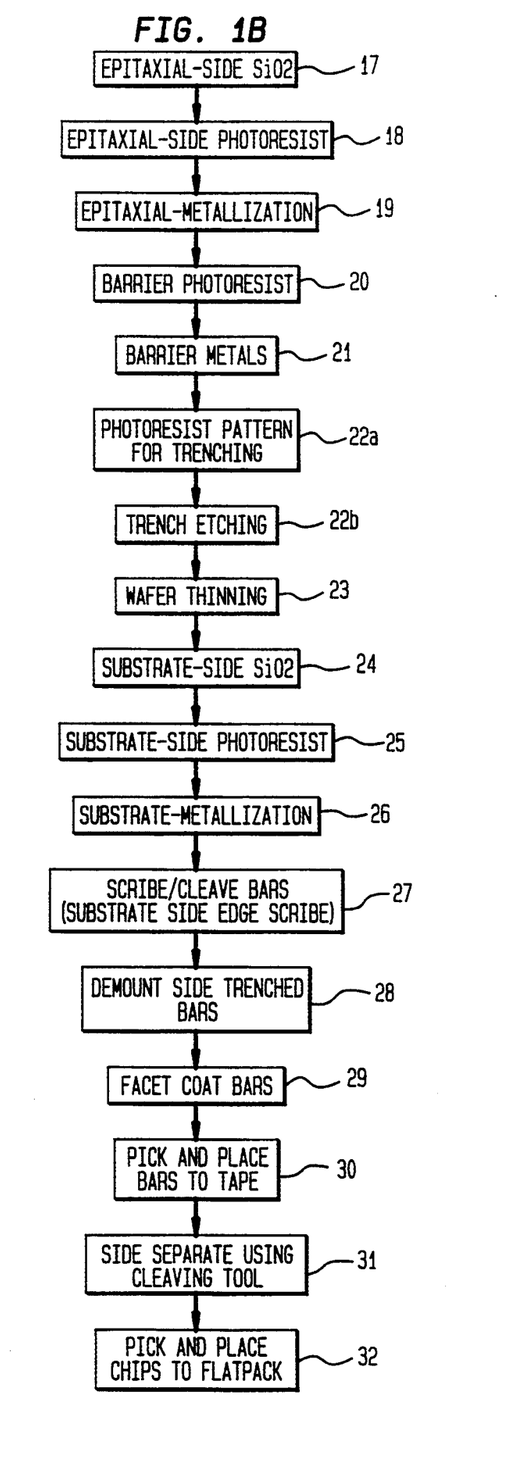
FIG. 1(b) is a flow chart describing the major processing steps of a process in accordance with an embodiment of the present invention.
Figure 2:
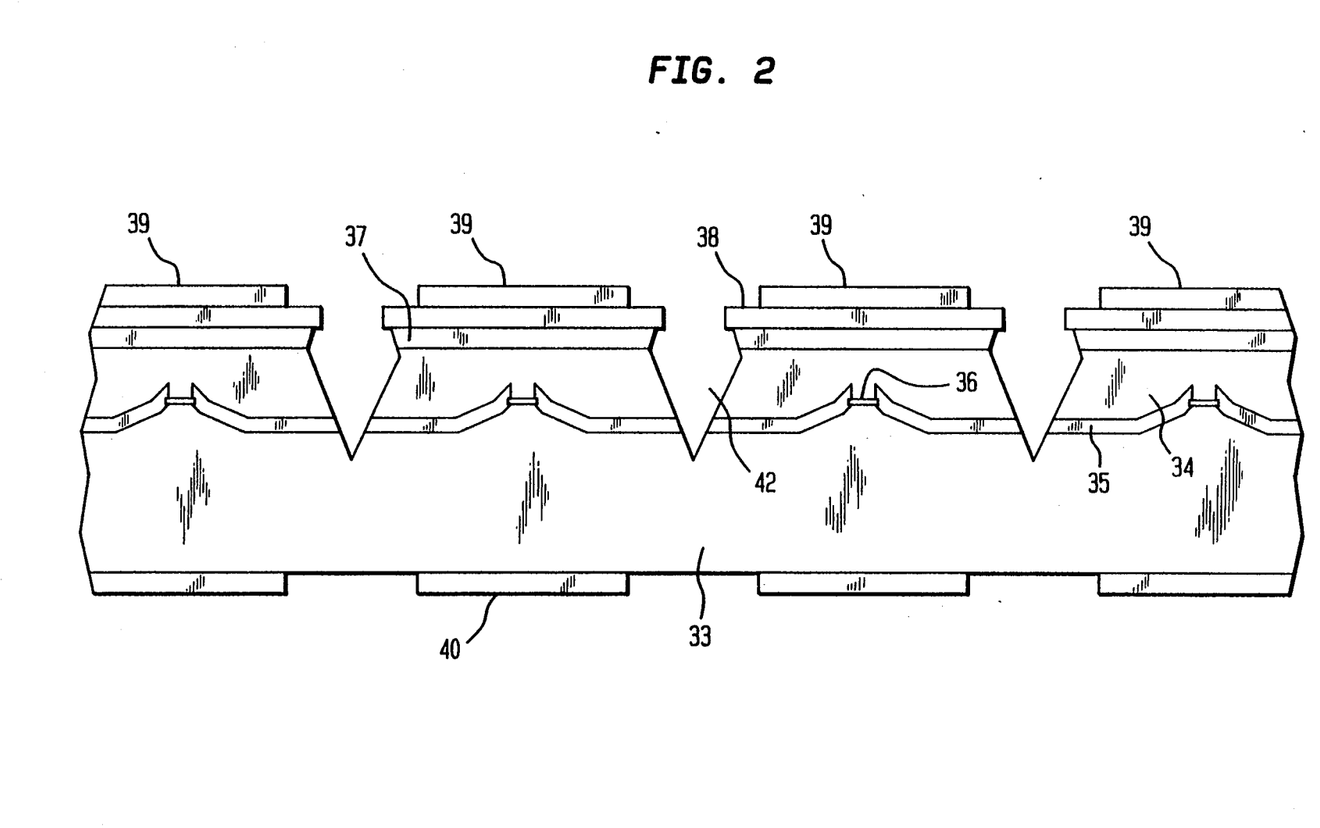
FIG. 2 is a cross-sectional view of a trenched semiconductor wafer illustrating the layers of said semiconductor wafer and the shape of the trench.

As in the conventional process, illustrated in FIG. 1(a) the process of the invention, shown in flow chart form in FIG. 1(b), begins (as shown in FIG. 2) with an indium phosphide substrate 33 having a previously defined active region 36, indium phosphide blocking layers 35, and an indium phosphide cap layer 34, and a ternary or quaternary cap layer 37. A silicon dioxide layer 38 is deposited over the cap layer 37. The epitaxial side of the wafer receives a coating of silicon dioxide at step 17 (FIG. 1(b). A patterned photoresist layer at step 18, used to form the metallization layer 39 of titanium, platinum and gold is then deposited over oxide layer 38 and cap layer 37. Formation of a barrier photoresist is carried out as in step 20 on the epitaxial side of the water after which barrier metallization is then deposited in step 21.

Figure 3:
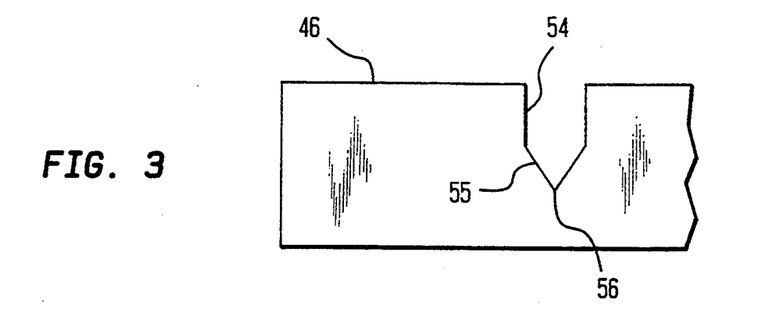
FIG. 3 is an end cross-sectional view showing the shape of the trench.
Figure 4A:
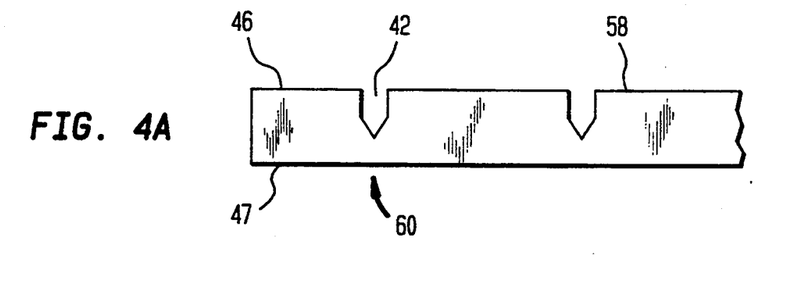
FIG. 4 is a cross-sectional view of the steps of cleaving a trench-etched electro-optical device bars into individual devices at four times.
Figure 4B:
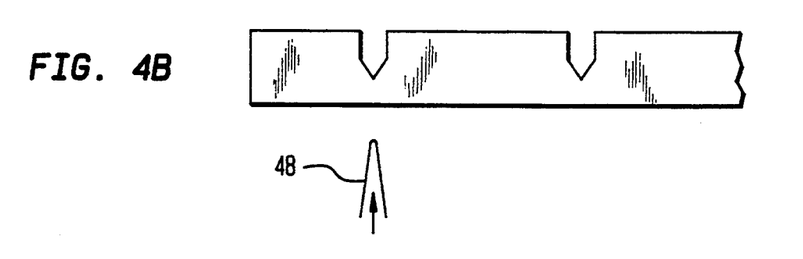
Figure 4C:
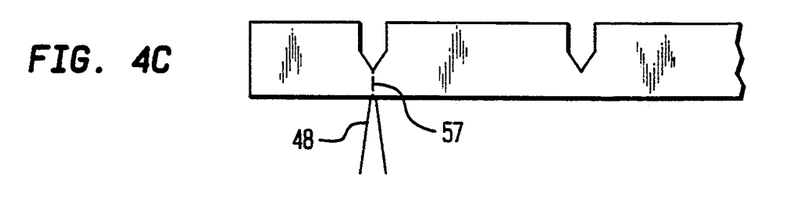
Figure 4D:
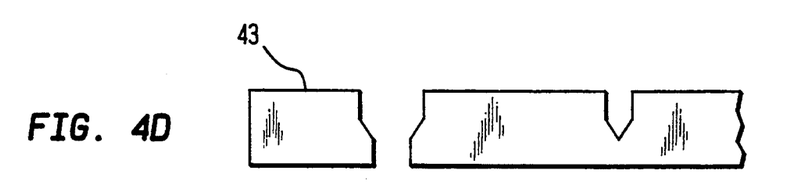

In a departure from the conventional process described in FIG. 1(a), after the formation of the barrier metalization in step 21, in the process of the invention, a trench etching operation is carried out at steps 22(a) and. 22(b), which does away with the need for side scribing step 11 in the conventional process. The etching of the trenches occurs during wafer processing and preferably as the last epitaxial side process step prior to thinning the wafer at step 23. The etching of the trench is accomplished in two steps. First a photoresist pattern is applied to the wafer as shown at step 22(a), and a window preferably between 2 and 6 μm is photolithographically patterned along the side of each device representative of the trench boundaries. This pattern is etched at step 22(b) through the $SiO_2$ layer 38 and through the underlying cap layer 37, epitaxial layer 34, and blocking layer 35 to extend into the substrate 33 at the patterned locations. To form the trench, the ternary top cap layer 37 is preferably etched with a solution of 1:8:8 $H_2SO_4:H_2O_2:H_2O$, and the blocking layers and substrate are preferably etched using a solution of 5:1 $HCL:H_3PO_4$. In this manner, a trench 42 is etched through the mask layer and extends into the substrate as shown at FIG. 2. The trench 42 preferably reaches approximately 10 μm deep and has straight sidewalls 54 part of the way down and then tapers 55 to a point at the bottom 56 as shown in FIG. 3. The angular shape of the trench 42 ensures that an impacting cleaving tool 48 produces a cleave 57 at the proper site, as shown in FIG. 4.

The formation of trenches offers many advantages over conventional side scribing. The trench 42 provides electrical isolation from the adjoining devices 43 since it continues along the entire length of the wafer 44 and has material etched away down to the substrate 33, thus removing any conductive path. Individual devices while in bar form can thus be tested electrically. The formation of trenches 42 thus saves approximately 10-12 hours of scribing time for a 2" round waiter, as compared to conventional scribing, even though it typically takes between one and two hours to form the trenches. The formation of the trenches 42 further reduces the possibillity of cracking devices from the side scribe mark 45 in the conventional process during bonding and reduces the possibility of shorting at the side scribe mark for epitaxial side down bonding. Yield loss is also reduced since conventional side scribe breakage is eliminated. Since the epitaxial side of the wafer no longer needs scribing, the dust produced by such scribing in the conventional process is absent and no longer mars visual inspection for defects. The trench formation of the process of the invention produces stronger bars that allow easier and quicker handling with reduced yield loss in the following process steps 28, 29, and 30.

Wafer thinning, at step 23, occurs after the formation of the trenches. The substrate side of the wafer then receives a layer of $SiO_2$, as shown at step 24, the substrate side of the wafer is then photoresisted, as shown at step 25, and metallized at step 26 for the purpose of creating the necessary gold-germanium and titanium or platinum and gold electrical contacts 40.

Figures 5A, 5B:
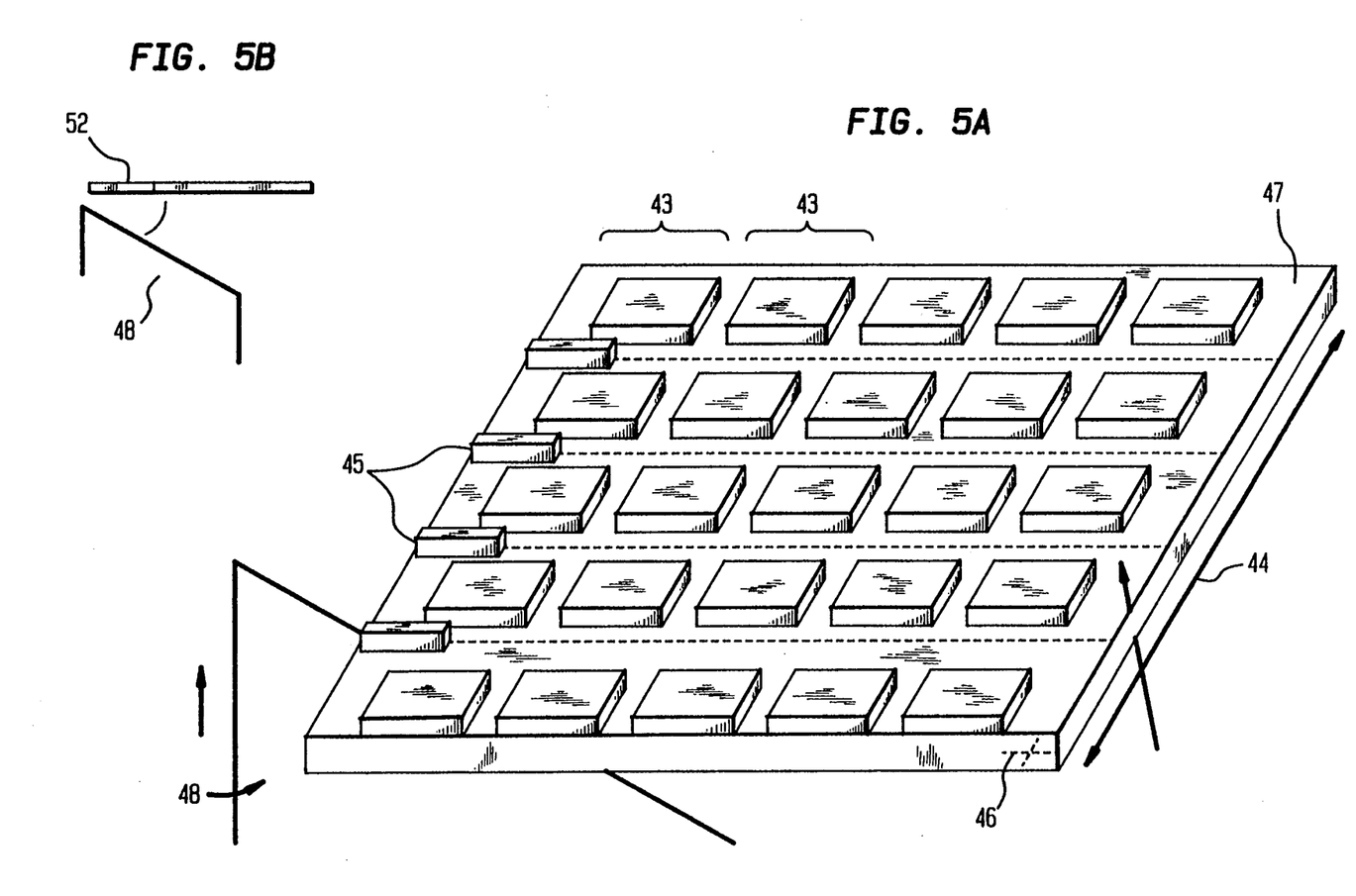
FIG. 5(a) is a perspective view of the substrate side of a semiconductor wafer illustrating the scribe marks and cleavage sites.
FIG. 5(b) is an end cross-sectional view of an angled cleaving tool striking a side scribed wafer from the epitaxial side.
Figure 8A:
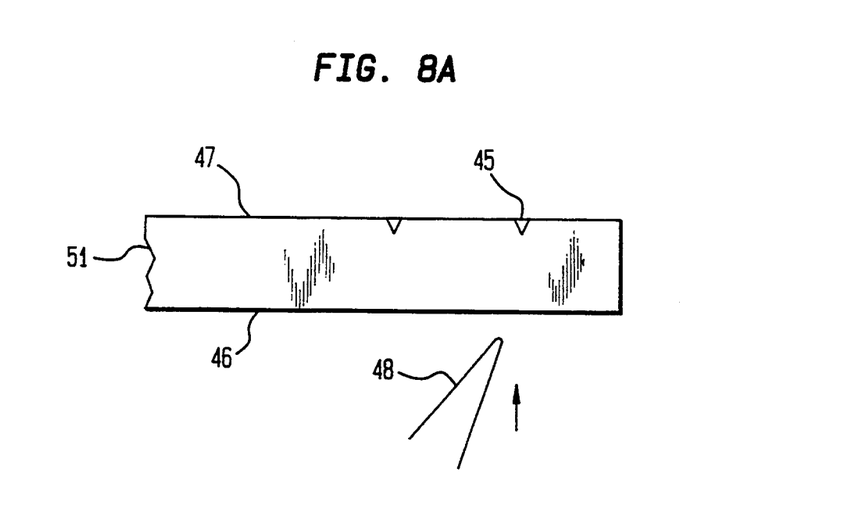
FIG. 8 is a cross-sectional view of a breaking tool striking the epitaxial side of a wafer.
Figure 8B:
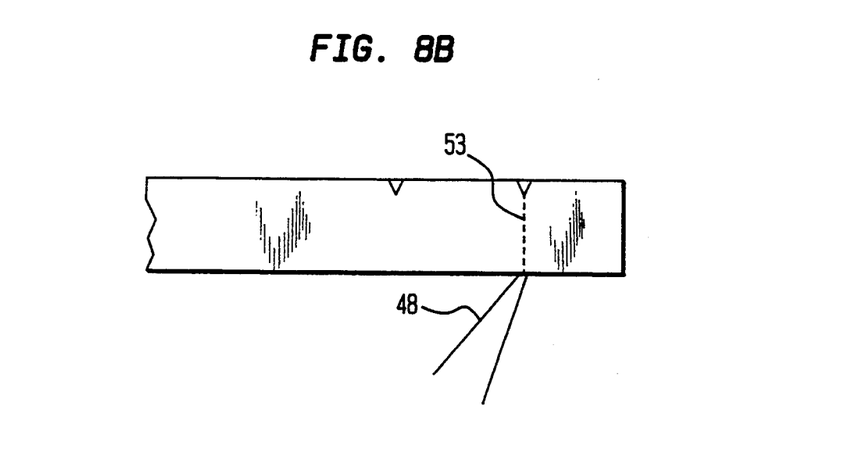
Figure 8C:
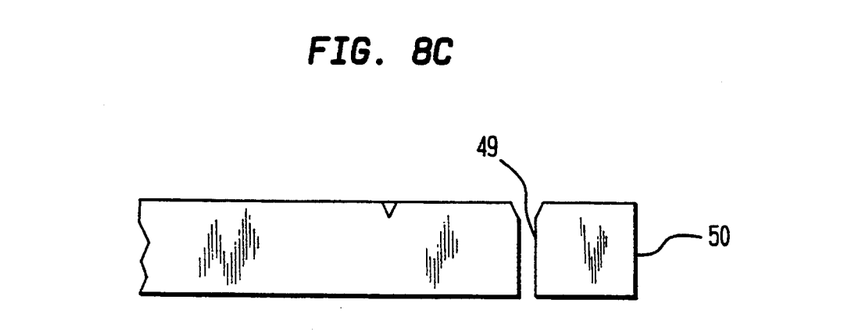

The next step is scribing the bar with a substrate side edge scribe in step 27 in contrast to conventional process step 10, in which the scribe is carried out on the epitaxial side of the wafer. The substrate side scribing and cleaving process consists of mounting the wafer on the scribing tape platform epitaxial side (or epitaxial side) 46 against the tape. Short scribe marks 45 are placed on the substrate side 47 of the wafer. A cleaving tool 48, such as a Dynatex cleaving tool, cleaves the bar 50 from the wafer 51 by striking the wafer with an angled blade 48, as shown in FIG. 5(b), in an impulse that applies force only to the edge of the wafer with the scribe 52. FIG. 8 shows this cleaving process at four points of time. The impact point generates a cleave that becomes the edge of the bar 53. (The freshly cleaved edge prevents an unwanted cleave from propagating from a defect or damage on the edge). The step of substrate side scribing shown at step 27 consistently produces hackle-free electro-optical device facets. After substrate side scribing and cleaving, the bars 58 are demounted, at step 28, and the electro-optical device facets are coated in a conventional manner, at step 29. The coated bars are then mounted for further cleaving the bars into individual electro-optical devices.

Figure 6:
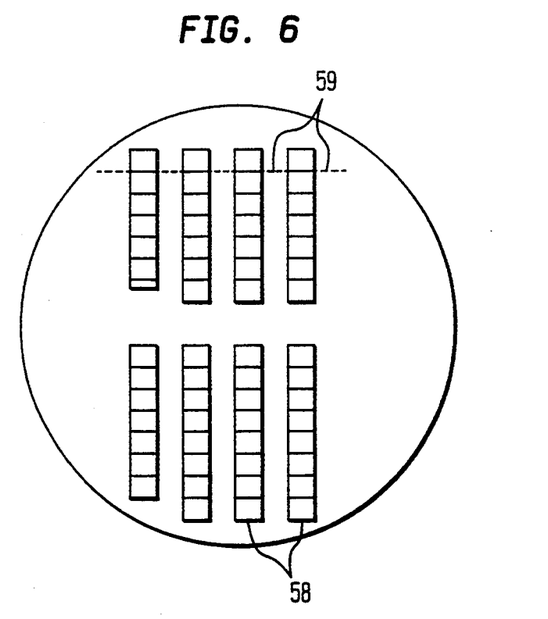
FIG. 6 is a top view of a series of semiconductor bars with trenches aligned on a mounting platform in preparation for device separation.

In accordance with a further novel aspect of the present invention, the electro-optical device bar mounting operation, as shown in step 30, is mechanized by using a pick and place machine modified for this purpose. Performance of this step by machine was not practical in the conventional process, which instead placed the bars on the tape manually (step 14, FIG. 1(a)) because of the fragility and brittleness of conventionally scribed spitaxial side scribed bars. However, it has been discovered that the etching of trenches in step 22, in place of conventional scribing, results in the bars 58 remaining sufficiently strong to allow higher yields with machine-handling. In the pick-and-place step 30 of the process, after facet coating, the loose electro-optical device bars 58 are picked up and placed on tape in parallel with their side trenches aligned 59, as illustrated in FIG. 6, for high throughput cleaving on the cleaving tool in step 31. Loose bar alignment by the use of crosshairs on the input stage achieves parallel mounting as shown in FIG. 6.

Figure 7:
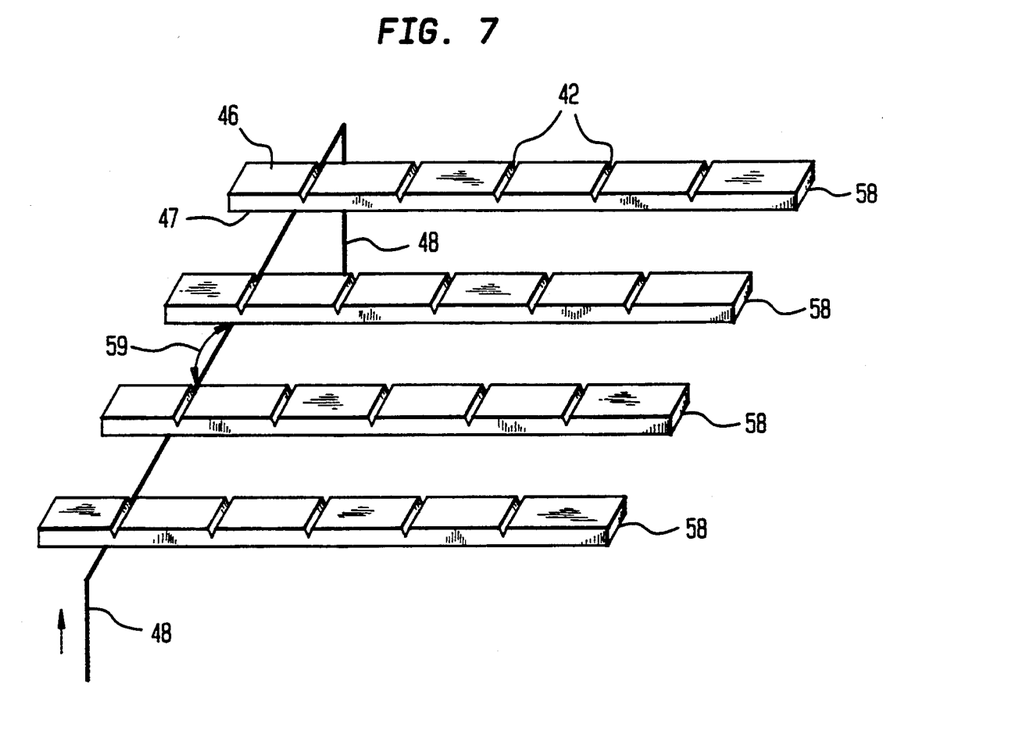
FIG. 7 is an elevated perspective view of the bar-to-device cleaving operation.

As shown in FIG. 7, step 31 may be performed on a plurality of bars simultaneously for high throughput, greater speed and thus lower cost. A standard tool used to handle individual devices may be used to handle the electro-optical device bars, and to place them on a hoop of mounting tape, such as UV sensitive low-tack tape. No-tack tape has proved to be less effective since the bars must stick once they are placed, so that no further shifting can occur. Although some rotation of the bars may occur after parallel bar alignment, rotational displacement of the bars is minimized by using a collet specifically designed to handle electro-optical device bars rather than a collet used for individual electro-optical device handling.

After side separation of individual devices from bar form, using a breaker tool as in step 31, the individual devices are picked and placed to a flatpack, as shown at step 32, at which time the process is essentially complete. The electro-optical device bars 58 are cleaved to electro-optical devices 43 by the use of a Dynatex cleaving tool or its equivalent, which applies force directly beneath the trench 60 or side scribe mark, as depicted in FIG. 4. This results in increased yield by preventing the formation of multiple chips due to non-cleaving and achieves better overall chip appearance on both the substrate and epitaxial sides 46, 47 (FIG. 4). The step of picking and placing the bars to tape, increases the throughput by allowing cleavage of many bars at the same time, as illustrated in FIG. 7. The process of the invention saves time by processing multiple bars together, although it requires approximately an additional 30 minutes per quad sized wafer as compared to the current conventional single bar process.

The novel steps of the present invention, steps 22, 27, 30, 31, complement each other and, contribute to making the other steps more effective. For example, the trench etching step 22 proves more effective when it is performed along with substrate side scribing 27 and side cleaving step 31 using a cleaving tool. Without the hackle-free facets obtained through the use of substrate side scribing step 27, the trench etching alone could lead to excessive hackle. Also, without the high side separation yield process achieved with the cleaving tool, the separation of the wafer in the formation of the trenches would be less efficient if it were used in conjunction with the conventional method of device separation using a manual flexing technique.

The etching of the trenches in the process of the invention contributes to the efficient use of substrate side scribing by eliminating two problems present in conventional scribing methods. Without the trenches, side scribes must be put on the epitaxial side prior to mounting the wafer epitaxial side down for mirror scribing, or else the side scribes must be put on the substrate side. The first alternative leads to unwanted cleaving from the side scribes during mirror cleaving and the second results in non-straight edges and chipouts on the epitaxial side (using the conventional flex type cleaving technique). The formation of trenches in the invented process avoids both of these problems and permits the subsequent side separation by the use of substrate side mirror scribing.

The description of the invented process is intended to be illustrative only and not limiting. Only the claims are intended to limit the invented process.

What is claimed is:

1. A method of fabricating a semiconductor electro-optical device comprising the steps of:
    forming at least one epitaxial layer upon a substrate wafer;
    applying at least one oxide layer on said epitaxial layer;
    placing a scribe mark on the substrate side of said wafer at the position corresponding to the location at which the wafer-to-bar cleave of said wafer will occur;
    mounting said wafer on a scribing platform;
    cleaving said wafer into at least one bar by striking the epitaxial side of said wafer with cleaving tool;
    mounting said bar on a scribing platform; and
    cleaving said bar into individual electro-optical devices.

2. A method of fabricating a semiconductor electro-optical device comprising the steps of
    forming pattern of lines across the epitaxial side of a wafer or bar of semiconductor material, said lines defining the boundary of potential semiconductor electro-optical devices;
    forming at least one epitaxial side trench in said wafer or bar by etching said pattern into the substrate such that said trench extends into said substrate;
    mounting said wafer on a scribing platform;
    cleaving said wafer into at least one said bar;
    mounting at least one said bar on a scribing platform; and
    cleaving said bar into individual electro-optical devices by striking the bar at a corresponding position on the substrate side of the bar opposite said trench.

3. The method of claim 2 in which the lower end of said trench is V-shaped defined by the intersection of two planes.

4. A method of fabricating a semiconductor electro-optical device comprising the steps of:
    forming pattern of lines across the epitaxial side of a wafer or bar of semiconductor material, said lines defining the boundary of potential semiconductor electro-optical devices, or forming a pattern of scribe marks, said marks defining the of the boundary of potential semiconductor devices;
    forming at least one epitaxial side trench in said wafer or bar by etching said pattern into the substrate such that said trench extends into said substrate, or forming at least one epitaxial side scribe mark in said wafer or bar;
    mounting said wafer on a scribing platform;
    cleaving said wafer into at least one said bar;
    mounting at least one said bar on a scribing platform; and
    cleaving said bar into individual electro-optical devices by striking the bar at a corresponding position on the substrate side of the bar opposite said trench or said scribe mark; and
    said cleaving of said bar performed by machine.

5. The method of claim 1, wherein said cleaving of said bar into individual devices further comprises the steps of:
    forming a pattern of lines across the epitaxial side of a wafer or bar of semiconductor material to define the location of potential semiconductor electro-optical devices;
    forming at least one epitaxial side trench in said wafer or bar by etching said pattern into the substrate;
    cleaving said wafer into at least one said bar; and
    cleaving said bar into individual electro-optical devices by striking the bar at a corresponding position on the substrate side of the bar opposite said trench.

6. The method of claim 2, wherein said cleaving of said wafer into at least one bar comprises the steps of:
    forming at least one epitaxial layer upon an substrate wafer;
    applying at least one oxide layer upon said epitaxial layer;
    placing a scribe mark on the substrate side of said wafer at the position corresponding to the place at which the wafer-to-bar cleave of said wafer will occur;
    mounting said wafer on a scribing platform;
    cleaving said wafer into at least one bar with a cleaving apparatus that strikes the epitaxial side of said wafer; and
    mounting at least one said bar on a scribing platform; and
    cleaving said bar into individual electro-optical devices.

7. The method of claim 1, wherein said mounting steps are performed by machine.

8. The method of claim 2, wherein said mounting steps are performed by machine.

* * * * *